(12) United States Patent
Wan et al.

(10) Patent No.: US 12,476,607 B2
(45) Date of Patent: Nov. 18, 2025

(54) ULTRA-HIGH FREQUENCY AT-CUT QUARTZ BLANK AND MANUFACTURING METHOD THEREOF

(71) Applicant: Taijing Technology Co., Ltd., Suizhou (CN)

(72) Inventors: Yang Wan, Suizhou (CN); Xiaowei Zhang, Suizhou (CN); Dayong Huang, Suizhou (CN)

(73) Assignee: Taijing Technology Co., Ltd., Suizhou (CN)

( * ) Notice: Subject to any disclaimer, the term of this patent is extended or adjusted under 35 U.S.C. 154(b) by 710 days.

(21) Appl. No.: 17/963,018

(22) Filed: Oct. 10, 2022

(65) Prior Publication Data

US 2024/0106409 A1 Mar. 28, 2024

(30) Foreign Application Priority Data

Sep. 28, 2022 (CN) .......................... 202211187229.1

(51) Int. Cl.
*H03H 9/13* (2006.01)
*H03H 3/02* (2006.01)
(Continued)

(52) U.S. Cl.
CPC .............. *H03H 9/132* (2013.01); *H03H 3/02* (2013.01); *H03H 9/02023* (2013.01);
(Continued)

(58) Field of Classification Search
CPC ...... H03H 9/132; H03H 3/02; H03H 9/02023; H03H 9/02157; H03H 9/0595; H03H 9/19; H03H 2003/023
See application file for complete search history.

(56) References Cited

U.S. PATENT DOCUMENTS 3,339,091 A * 8/1967 Hammond ............... H03H 9/19
310/349
5,323,083 A * 6/1994 Smythe ............... H03H 9/1035
310/353
(Continued)

FOREIGN PATENT DOCUMENTS

CH 633921 A5 * 12/1982 ............... H03H 9/21
CN 201430164 A * 3/2010 ............. H01L 33/60
(Continued)

OTHER PUBLICATIONS

IP.com search report. (Year: 2025).*

*Primary Examiner* — Pedro J Cuevas
(74) *Attorney, Agent, or Firm* — Zhigang Ma

(57) ABSTRACT

Disclosed is an ultra-high frequency AT-cut quartz blank and manufacturing method thereof. The ultra-high frequency AT-cut quartz blank comprises a vibrating blank, an electrode assembly and a connection assembly, one side of the vibrating blank is provided with a first groove; the electrode assembly comprises a first electrode, a connecting blank, and a second electrode; the connection assembly comprises a first connecting electrode and a second connecting electrode, the first connecting electrode is electrically connected to the first electrode, the second connecting electrode is electrically connected to the second electrode and extends to the outer wall of the connecting wafer, so that the first electrode and the second electrode form an inverse piezoelectric effect under the action of an alternating electric field. this disclosure can solve the problem of fragmentation or fragmentation of quartz blank.

10 Claims, 4 Drawing Sheets

(51) Int. Cl.
*H03H 9/02* (2006.01)
*H03H 9/05* (2006.01)
*H03H 9/19* (2006.01)

(52) U.S. Cl.
CPC .... *H03H 9/02086* (2013.01); *H03H 9/02157* (2013.01); *H03H 9/0595* (2013.01); *H03H 9/19* (2013.01)

(56) References Cited

U.S. PATENT DOCUMENTS

| | | | | |
|---|---|---|---|---|
| 9,748,920 | B2 * | 8/2017 | Ishii | H03H 9/19 |
| 10,530,299 | B2 * | 1/2020 | Kikuchi | H03H 3/02 |
| 2012/0079691 | A1 * | 4/2012 | Takano | H03H 3/02 |
| | | | | 29/25.35 |
| 2013/0328637 | A1 * | 12/2013 | Ishii | H03H 3/04 |
| | | | | 331/155 |
| 2014/0292437 | A1 * | 10/2014 | Tanaka | H10N 30/2023 |
| | | | | 331/158 |
| 2015/0091665 | A1 * | 4/2015 | Yamamoto | H03H 9/0542 |
| | | | | 310/365 |
| 2015/0115772 | A1 * | 4/2015 | Ishii | H03H 9/1021 |
| | | | | 310/318 |
| 2017/0230003 | A1 * | 8/2017 | Kikuchi | H03H 9/13 |

FOREIGN PATENT DOCUMENTS

| | | | | | |
|---|---|---|---|---|---|
| CN | 201430164 | Y | * | 3/2010 | |
| CN | 104883153 | A | * | 9/2015 | ......... H03H 9/02157 |
| CN | 117833860 | A | * | 4/2024 | ............... H03H 3/02 |
| CN | 113630099 | B | * | 3/2025 | ............ H03H 9/171 |
| JP | 2004207913 | A | * | 7/2004 | ............... H03H 9/19 |
| JP | 2012029166 | A | * | 2/2012 | ............... H03H 9/02 |
| TW | I539560 | B | * | 6/2016 | ........... H03H 9/1021 |
| TW | I893639 | B | * | 8/2025 | ............ H01L 21/302 |
| WO | WO-9112662 | A1 | * | 8/1991 | ............... H03H 9/19 |

* cited by examiner

ULTRA-HIGH FREQUENCY AT-CUT QUARTZ BLANK AND MANUFACTURING METHOD THEREOF

FIELD OF THE DISCLOSURE

The disclosure relates to the technical field of quartz crystal resonator, in particular to an ultra-high frequency AT-cut quartz blank and manufacturing method thereof.

BACKGROUND

Quartz crystal resonators are usually composed of piezoelectric quartz blank and packaging shells. The piezoelectric quartz blanks are mostly rectangular plate structures, and the packaging shell materials are mostly metal or ceramic. The upper and lower sides of the piezoelectric quartz blank need to be evaporated or sputtered with electrodes and are connected to a base pin in the package housing. The AC voltage can connect the upper and lower electrodes of the quartz blank through the pin, so that the quartz blank has an inverse piezoelectric effect, resulting in oscillation. Quartz crystal resonators are widely used in electronic industries such as mobile electronic devices and communication devices due to their frequency accuracy and stability.

With the rapid development of mobile communication technology, the demand for miniaturization of devices is increasing, and the miniaturization and high frequency of quartz crystal resonators are also imperative. And with the promotion of 5G, the timeliness of information transmission is increasingly important, and demand for high-frequency signal sources, high-frequency resonators, and high-frequency oscillator is also increasing, which requires quartz crystal resonators to be miniaturized and high-frequency. Limited by the existing process, the thickness of the quartz blank is usually reduced to meet the demand of the frequency, and the mass production process can achieve a maximum of 155 MHz quartz fundamental frequency blank after the thinning reaches the limit. However, after exceeding this frequency, the electrodes are connected to the surface of the two sides of the quartz crystal blank, which results in a mass load effect. At the same time, due to the thinness of the blank, it is easy to cause fragmentation.

Therefore, there is an urgent need for an ultra-high frequency AT-cut quartz blank and manufacturing process thereof to solve the problem of quartz blank fragmentation caused by the mass loading effect resulting from the electrodes being connected to two opposite sides of the thinned quartz blank in the existing technology.

SUMMARY

The purpose of this disclosure is to provide ultra-high frequency AT-cut quartz blank and manufacturing method thereof to solve the problem of quartz blank fragmentation caused by the mass loading effect resulting from the electrodes being connected to two opposite sides of the thinned quartz blank.

This disclosure also provides an ultra-high frequency AT-cut quartz blank, comprising a vibrating blank, an electrode assembly, and a connection assembly, wherein:

One side of the vibrating blank is provided with a first groove.

The electrode assembly comprises a first electrode, a connecting blank, and a second electrode, the first electrode is arranged on the opposite side of the first groove and connected to the vibrating blank, the connecting wafer is connected to one side of the vibrating blank, and the connecting wafer is enclosed with the first groove to form a connecting chamber, the second electrode is embedded in the connecting chamber, the second electrode is set relative to the first electrode, and connected to the connection wafer.

The connection assembly comprises a first connecting electrode and a second connecting electrode, the first connecting electrode is electrically connected to the first electrode, the second connecting electrode is electrically connected to the second electrode and extends to the outer wall of the connecting wafer, so that the first electrode and the second electrode form an inverse piezoelectric effect under the action of an alternating electric field.

This disclosure also provides a manufacturing method of the ultra-high frequency AT-cut quartz blank, comprising the following steps:

S1, taking a supporting wafer with a certain size, and forming the first through hole on the surface of the supporting wafer through the process of coating, spin coating photoresist, exposure, development etching, and corrosion;

S2, connecting the supporting wafer to the vibrating wafer by lamination or bonding, and forming the first groove and the second groove by corrosion process;

S3, forming the first connecting electrode on the supporting wafer by photolithography, and forming the first electrode on the vibrating wafer by photolithography;

S4, forming the second through hole on the surface of the connecting wafer through the process of coating, spin coating photoresist, exposure, development etching, and corrosion, and forming the second electrode on the surface of the connecting wafer through evaporation or sputtering;

S5, connecting the connecting wafer after step S4 to the vibrating wafer formed in step S3 by laminating or bonding;

S6, forming cutting positioning lines on the supporting wafer, the vibrating wafer, and the connecting wafer formed in the step S5, and using laser cutting or blade cutting to cut and separate along the cutting positioning lines, so as to obtain the ultra-high frequency AT-cut quartz blank.

Compared with the prior art, the beneficial effects of this disclosure are: the first electrode and the second electrode are set on the two opposite sides of the vibrating blank. The first groove is set on one side of the vibrating blank, and the connecting wafer is connected to one side of the vibrating blank, which is enclosed with the first groove to form the connecting chamber for installing the second electrode. The second electrode is placed in the connecting chamber relative to the first electrode and connected to the connecting wafer to make a gap between the second electrode and the vibrating blank to form an air gap electrode structure. That is, only one side of the vibrating blank is plated with first electrode, and the second electrode is not directly connected to the thinned vibrating blank, but is connected to the thinned vibrating blank through the connecting wafer. Compared with the existing technology, after the electrodes are powered on, the thinned vibrating blank will produce a mass load effect only on the side connected with the first electrode, therefore, the mass load effect will also be reduced. Thus, the fabrication difficulty of ultra-high frequency quartz blank is greatly reduced.

BRIEF DESCRIPTION OF THE DRAWINGS

Accompanying drawings are for providing further understanding of embodiments of the disclosure. The drawings form a part of the disclosure and are for illustrating the principle of the embodiments of the disclosure along with the literal description. Apparently, the drawings in the description below are merely some embodiments of the disclosure, a person skilled in the art can obtain other drawings according to these drawings without creative efforts. In the figures.

DETAILED DESCRIPTION OF PREFERRED EMBODIMENTS

Figure 1:
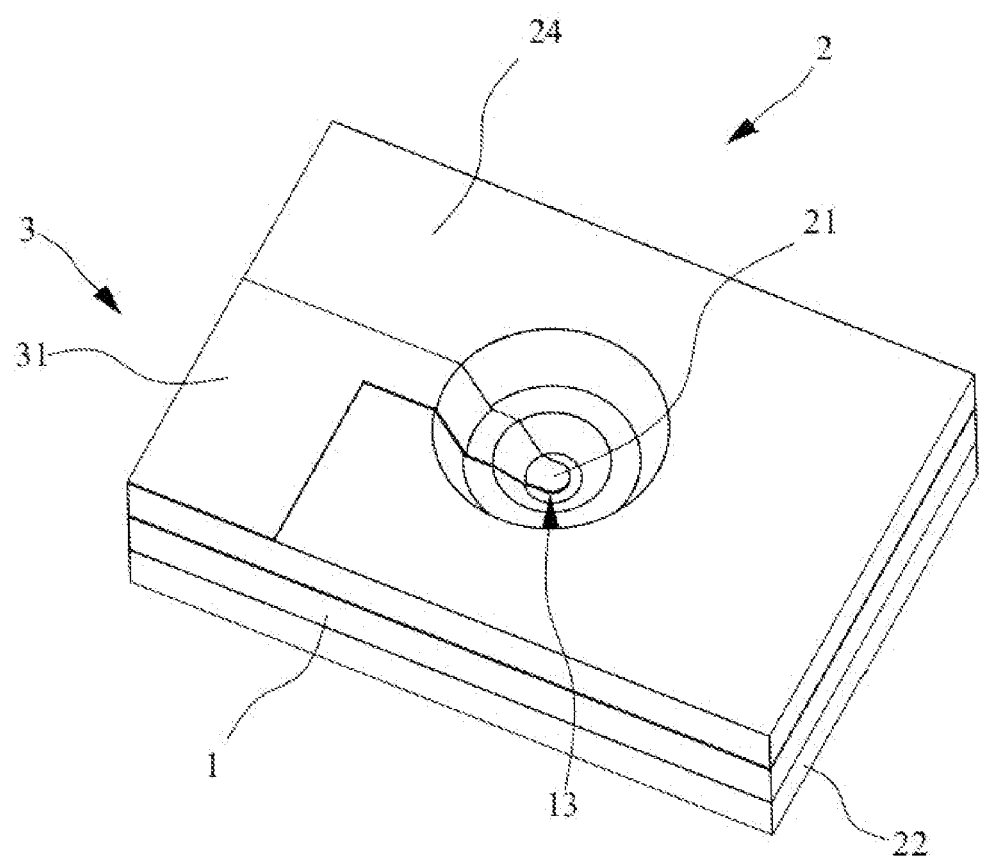
FIG. 1 is a three-dimensional structure diagram of the ultra-high frequency AT-cut quartz blank provided by an embodiment of this disclosure.
Figure 2:
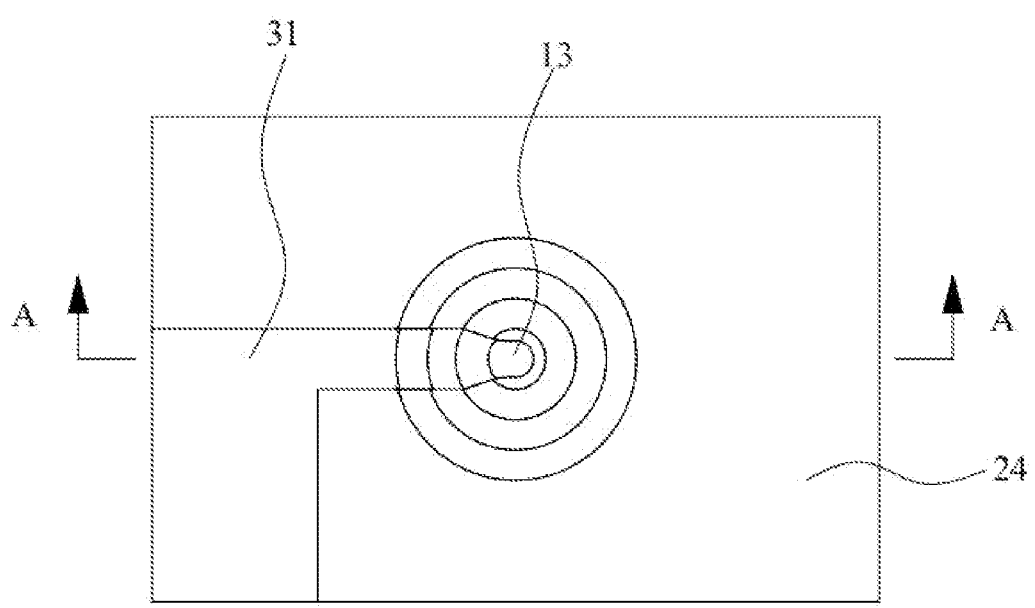
FIG. 2 is a top view of FIG. 1.

Please refer to FIG. 1 to FIG. 4, this disclosure provides an ultra-high frequency AT-cut quartz blank, comprising a vibrating blank 1, an electrode assembly 2 and a connection assembly 3 for electrically connecting the electrode assembly 2, one side of the vibrating blank 1 is provided with a first groove 11, the electrode assembly 2 comprises a first electrode 21, a connecting wafer 22, and a second electrode 23, the first electrode 21 is arranged on the opposite side of the first groove 11 and connected to the vibrating blank 1, the connecting wafer 22 is connected to one side of the vibrating blank 1, and the connecting wafer 22 is enclosed with the first groove 11 to form a connecting chamber 12, the second electrode 23 is embedded in the connecting chamber 12, the second electrode 23 is set relative to the first electrode 21, and connected to the connection wafer 22. The connection assembly 3 comprises a first connecting electrode 31 and a second connecting electrode 32, the first connecting electrode 31 is electrically connected to the first electrode 21, the second connecting electrode 32 is electrically connected to the second electrode 23 and extends to the outer wall of the connecting wafer 22, so that the first electrode 21 and the second electrode 23 form an inverse piezoelectric effect under the action of an alternating electric field.

In this device, the first electrode 21 and the second electrode 23 are set on the two opposite sides of the vibrating blank 1. The first groove 11 is set on one side of the vibrating blank 1, and the connecting wafer 22 is connected to one side of the vibrating blank 1, which is enclosed with the first groove 11 to form the connecting chamber 12 for installing the second electrode 23. The second electrode 23 is placed in the connecting chamber 12 relative to the first electrode 21 and connected to the connecting wafer 22 to make a gap between the second electrode 23 and the vibrating blank 1 to form an air gap electrode structure. That is, only one side of the vibrating blank 1 is plated with first electrode 21, and the second electrode 23 is not directly connected to the thinned vibrating blank 1, but is connected to the thinned vibrating blank 1 through the connecting wafer 22. Compared with the existing technology, after the electrodes are powered on, the thinned vibrating blank 1 will produce a mass load effect only on the side connected with the first electrode 21, therefore, the mass load effect will also be reduced. Thus, the fabrication difficulty of ultra-high frequency quartz blank is greatly reduced.

Figure 3:
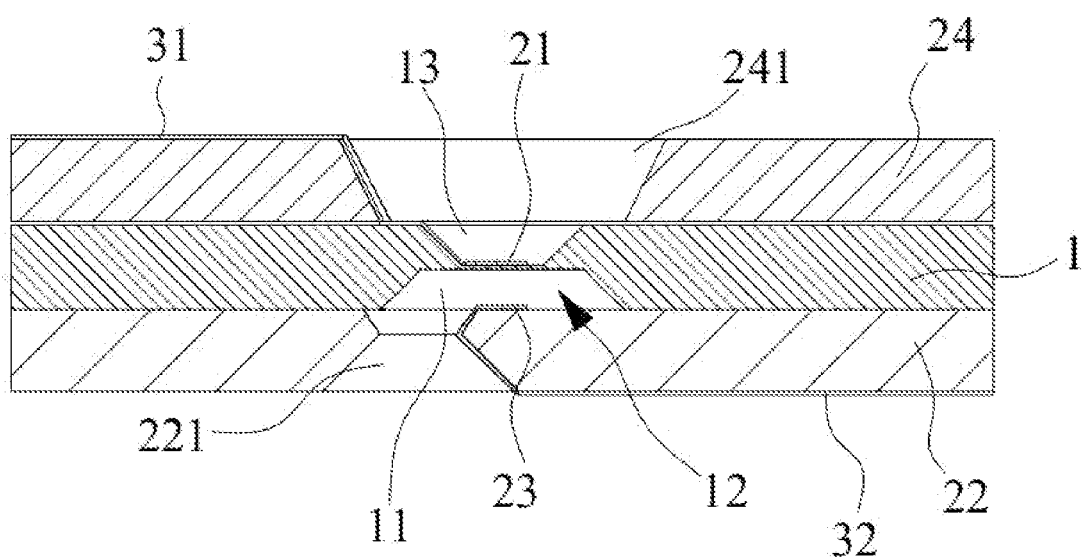
FIG. 3 is a sectional view of Section A-A in FIG. 2.
Figure 4:
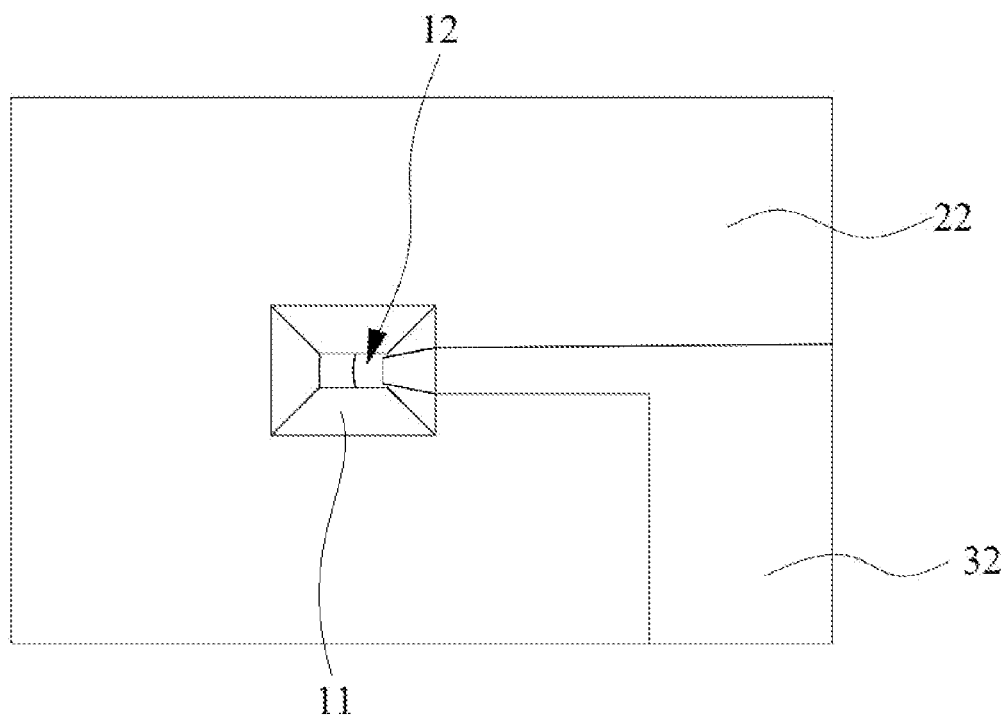
FIG. 4 is a bottom view of FIG. 1.

As shown in FIG. 3, a second groove 13 is also provided on the other side of the vibrating blank 1, the second groove 13 and the first groove 11 are opposite to each other on the two opposite sides of the vibrating blank 1, and the first electrode 21 is connected to the bottom inner wall of the second groove 13.

Furthermore, the electrode assembly 2 also comprises a supporting wafer 24, which is connected to one side of the vibrating blank 1, and the supporting wafer 24 is provided with a first through hole 241 relative to the first groove 11, the first through hole 241 runs through the supporting wafer 24, the first connecting electrode 31 is connected to the first electrode 21 through the first through-hole 241, and the first connecting electrode 31 is arranged along the inner wall of the first through-hole 241, and extending and connecting to the outer wall of the supporting wafer 24.

It can be understood that, in order to meet the production demand of ultra-high fundamental frequency and avoid the strength reduction of blank structure caused by the thickness reduction of the vibrating blank 1, the device also increases the strength of vibrating blank 1 by connecting the supporting wafer 24 and the vibrating blank 1.

Furthermore, from the perspective of optimal selection of production process, the strength of quartz crystal blanks is improved by setting the supporting wafer 24. Firstly, grooves with the same depth are etched at the top surface and bottom surface of the vibrating blank 1, and then the supporting wafer 24 with etched through holes is connected to the surface of the vibrating blank 1. Compared with the vibrating blank 1 with the same thickness, the device has better process advantages.

As an embodiment, as shown in FIG. 3, the connecting wafer 22 is provided with a second through hole 221, the second through hole 221 runs through the connecting wafer 22, and is connected with the connecting chamber 12. The second connecting electrode 32 is connected to the second electrode 23 through the second through hole 221, and the second connecting electrode 32 is arranged along the inner wall of the second through hole 221, and extends to the outer wall of the connecting wafer 22.

It can be understood that the second electrode 23 realizes electrical connection by the second connecting electrode 32 electroplated on the surface of the connecting wafer 22. Considering the selection of production process, electroplating the second connecting electrode 32 on the surface of the connecting wafer 22 is the optimal process selection.

As a preferred embodiment, the projection area of the second electrode 23 on the bottom inner wall of the first groove 11 is equal to the area of the first electrode 21 connected to the bottom inner wall of the second groove 13.

It can be understood that the first electrode 21 and the second electrode 23 in this device are electrically connected with the positive and negative electrodes through the connecting electrodes respectively. The equal projection areas of the first electrode 21 and the second electrode 23 means that the electric field intensity between the positive and negative electrodes will be relatively uniform, which is beneficial to the excitation effect of the electric field on the quartz blank.

In an embodiment, in order to meet the production needs, the connecting wafer 22 is made of quartz, the length of the connecting wafer 22 is 700~2000 μm, the width of the connecting wafer 22 is 500~2500 μm, and the overall thickness of the connecting wafer 22 is 50~200 μm.

Furthermore, the cross section of the second through hole 221 is rectangular, the length of the second through hole 221 is 15~120 μm, and the width of the second through hole 221 is 15~120 μm.

In an embodiment, the supporting wafer 24 is made of quartz, the length of the supporting wafer 24 is 700~2000 μm, the width of the supporting wafer 24 is 500~2500 μm, the overall thickness of the supporting wafer 24 is 50~200

μm, and the diameter of the first through hole 241 in the supporting wafer 24 is 100-300 μm.

Furthermore, the vibrating blank 1 is made of quartz, the length of vibrating blank 1 is 700~2000 μm, the width of the vibrating blank 1 is 500~2500 μm, the overall thickness of the vibrating blank 1 is 50~200 μm, the radius of the first groove 11 and the second groove 13 is 30~200 μm, and the depth of the first groove 11 and the second groove 13 is 20~100 μm.

Furthermore, the first groove 11, the second groove 13, the second through hole 221, and the first through hole 241 in the device are formed by the processing method of corrosion. Therefore, the opening of the hole presents a certain increase or decrease trend along the axis direction of the hole. This is a conventional setting known to those skilled in the art.

This disclosure also provides a manufacturing method of the ultra-high frequency AT-cut quartz blank, comprising the following steps:

- S1, taking a supporting wafer 24 with a certain size, and forming the first through hole 241 on the surface of the supporting wafer 24 through the process of coating, spin coating photoresist, exposure, development etching, and corrosion;
- S2, connecting the supporting wafer 24 to the vibrating wafer 1 by lamination or bonding, and forming the first groove 11 and the second groove 13 by corrosion process;
- S3, forming the first connecting electrode 31 on the supporting wafer 24 by photolithography, and forming the first electrode 21 on the vibrating wafer 1 by photolithography;
- S4, forming the second through hole 221 on the surface of the connecting wafer 22 through the process of coating, spin coating photoresist, exposure, development etching, and corrosion, and forming the second electrode 23 on the surface of the connecting wafer 22 through evaporation or sputtering;
- S5, connecting the connecting wafer 22 after step S4 to the vibrating wafer 1 formed in step S3 by laminating or bonding;
- S6, forming cutting positioning lines on the supporting wafer 24, the vibrating wafer 1, and the connecting wafer 22 formed in the step S5, and using laser cutting or blade cutting to cut and separate along the cutting positioning lines, so as to obtain the ultra-high frequency AT-cut quartz blank.

In this device, the first electrode 21 and the second electrode 23 are set on the two opposite sides of the vibrating blank 1. The first groove 11 is set on one side of the vibrating blank 1, and the connecting wafer 22 is connected to one side of the vibrating blank 1, which is enclosed with the first groove 11 to form the connecting chamber 12 for installing the second electrode 23. The second electrode 23 is placed in the connecting chamber 12 relative to the first electrode 21 and connected to the connecting wafer 22 to make a gap between the second electrode 23 and the vibrating blank 1 to form an air gap electrode structure. That is, only one side of the vibrating blank 1 is plated with first electrode 21, and the second electrode 23 is not directly connected to the thinned vibrating blank 1, but is connected to the thinned vibrating blank 1 through the connecting wafer 22. Compared with the existing technology, after the electrodes are powered on, the thinned vibrating blank 1 will produce a mass load effect only on the side connected with the first electrode 21, therefore, the mass load effect will also be reduced. Thus, the fabrication difficulty of ultra-high frequency quartz blank is greatly reduced.

Further, when producing the blank structure in this disclosure, taking a supporting wafer 24 with a certain size, and grinding and polishing the upper and lower surfaces of the supporting wafer 24; the first through hole 241 is formed on the surface of the supporting wafer 24 through the process of coating, spin coating photoresist, exposure, development etching, and corrosion; connecting the supporting wafer 24 to the vibrating blank 1 by lamination or bonding; etching the supporting wafer 24 and vibrating blank 1 formed in the above step to make the thickness of the first groove 11 and the second groove 13 meet the required thickness requirements respectively; forming the first connecting electrode 31 on the supporting wafer 24 by photolithography, and forming the first electrode 21 on the vibrating blank 1 by photolithography; forming the second through hole 221 on the surface of the connecting wafer 22 through the process of coating, spin coating photoresist, exposure, development etching, and corrosion, and forming the second electrode 23 on the surface of the connecting wafer 22 through evaporation or sputtering; connecting the connecting wafer 22 after the above step to the vibrating blank 1 formed in the above step by laminating or bonding; forming cutting positioning lines on the supporting wafer 24, the vibrating blank 1, and the connecting wafer 22 formed in the step S5, and using laser cutting or blade cutting to cut and separate along the cutting positioning lines, so as to obtain the ultra-high frequency AT-cut quartz blank.

It is to be understood, however, that even though numerous characteristics and advantages of this disclosure have been set forth in the foregoing description, together with details of the structure and function of the invention, the disclosure is illustrative only, and changes may be made in detail, especially in matters of shape, size, and arrangement of parts within the principles of the invention to the full extent indicated by the broad general meaning of the terms in which the appended claims are expressed.

What is claimed is:

1. An ultra-high frequency AT-cut quartz blank, comprising a vibrating blank, an electrode assembly and a connection assembly, wherein:
   - one side of the vibrating blank is provided with a first groove;
   - the electrode assembly comprises a first electrode, a connecting wafer, and a second electrode, the first electrode is arranged on the opposite side of the first groove and connected to the vibrating blank, the connecting wafer is connected to one side of the vibrating blank, and the connecting wafer is enclosed with the first groove to form a connecting chamber, the second electrode is embedded in the connecting chamber, the second electrode is set relative to the first electrode, and connected to the connecting wafer;
   - the connection assembly comprises a first connecting electrode and a second connecting electrode, the first connecting electrode is electrically connected to the first electrode, the second connecting electrode is electrically connected to the second electrode and extends to the outer wall of the connecting wafer, so that the first electrode and the second electrode form an inverse piezoelectric effect under the action of an alternating electric field.

2. The ultra-high frequency AT-cut quartz blank according to claim 1, a second groove is also provided on the other side of the vibrating blank, the second groove and the first groove are opposite to each other on the two opposite sides of the vibrating blank, and the first electrode is connected to the bottom inner wall of the second groove.

3. The ultra-high frequency AT-cut quartz blank according to claim 2, the electrode assembly also comprises a supporting wafer, which is connected to one side of the vibrating blank, and the supporting wafer is provided with a first through hole relative to the first groove, the first through hole runs through the supporting wafer, the first connecting electrode is connected to the first electrode through the first through-hole, and the first connecting electrode is arranged along the inner wall of the first through-hole, and extending and connecting to the outer wall of the supporting wafer.

4. The ultra-high frequency AT-cut quartz blank according to claim 1, the connecting wafer is provided with a second through hole, the second through hole runs through the connecting wafer, and is connected with the connecting chamber; the second connecting electrode is connected to the second electrode through the second through hole, and the second connecting electrode is arranged along the inner wall of the second through hole, and extends to the outer wall of the connecting wafer.

5. The ultra-high frequency AT-cut quartz blank according to claim 2, the projection area of the second electrode on the bottom inner wall of the first groove is equal to the area of the first electrode connected to the bottom inner wall of the second groove.

6. The ultra-high frequency AT-cut quartz blank according to claim 1, the connecting wafer is made of quartz, the length of the connecting wafer is 700~2000 μm, the width of the connecting wafer is 500~2500 μm, and the overall thickness of the connecting wafer is 50~200 μm.

7. The ultra-high frequency AT-cut quartz blank according to claim 4, the cross section of the second through hole is rectangular, the length of the second through hole is 15~120 μm, and the width of the second through hole is 15~120 μm.

8. The ultra-high frequency AT-cut quartz blank according to claim 1, the supporting wafer is made of quartz, the length of the supporting wafer is 700~2000 μm, the width of the supporting wafer is 500~2500 μm, the overall thickness of the supporting wafer is 50~200 μm, and the diameter of the first through hole in the supporting wafer is 100-300 μm.

9. The ultra-high frequency AT-cut quartz blank according to claim 1, the vibrating blank is made of quartz, the length of vibrating blank is 700~2000 μm, the width of the vibrating blank is 500~2500 μm, the overall thickness of the vibrating blank is 50~200 μm, the radius of the first groove and the second groove is 30~200 μm, and the depth of the first groove and the second groove is 20~100 μm.

10. A manufacturing method of the ultra-high frequency AT-cut quartz blank according to claim 1, comprising the following steps:
   S1, taking a supporting wafer with a certain size, and forming the first through hole on the surface of the supporting wafer through the process of coating, spin coating photoresist, exposure, development etching, and corrosion;
   S2, connecting the supporting wafer to the vibrating blank by lamination or bonding, and forming the first groove and the second groove by corrosion process;
   S3, forming the first connecting electrode on the supporting wafer by photolithography, and forming the first electrode on the vibrating blank by photolithography;
   S4, forming the second through hole on the surface of the connecting wafer through the process of coating, spin coating photoresist, exposure, development etching, and corrosion, and forming the second electrode on the surface of the connecting wafer through evaporation or sputtering;
   S5, connecting the connecting wafer after step S4 to the vibrating blank formed in step S3 by laminating or bonding;
   S6, forming cutting positioning lines on the supporting wafer, the vibrating blank, and the connecting wafer formed in the step S5, and using laser cutting or blade cutting to cut and separate along the cutting positioning lines, so as to obtain the ultra-high frequency AT-cut quartz blank.

* * * * *